United States Patent
Bourdillon (10) Patent No.: US 6,953,643 B2
(45) Date of Patent: Oct. 11, 2005

(54) MASK SHAPING USING TEMPORAL AND SPATIAL COHERENCE IN ULTRA HIGH RESOLUTION LITHOGRAPHY

(76) Inventor: Antony J Bourdillon, P.O. Box 700001, San Jose, CA (US) 95170-0001

( * ) Notice: Subject to any disclaimer, the term of this patent is extended or adjusted under 35 U.S.C. 154(b) by 288 days.

(21) Appl. No.: 10/041,304

(22) Filed: Jan. 8, 2002

(65) Prior Publication Data

US 2003/0129503 A1 Jul. 10, 2003

(51) Int. Cl.$^7$ .............................. G03F 9/00; G03C 5/00
(52) U.S. Cl. ............................ 430/5; 430/30; 430/296; 430/311; 430/942; 378/35
(58) Field of Search .............................. 430/5, 30, 296, 430/311, 942; 378/35

(56) References Cited

U.S. PATENT DOCUMENTS 6,194,104 B1    2/2001  Hsu
6,383,697 B1 *  5/2002  Vladimirsky et al. ......... 430/30

OTHER PUBLICATIONS

O. W.Otto et al.Automated Optical Proximity Correction—a Rules Based Approach Optical/Laser Microlithography VII Proc. SPIE (2197) 1994 pp. 278–293.

S.Shiori et al. Fast Optical Proximity Correction—Analytical Method Optical/Laser Microlithography VIII Proc. SPIE (2440) 1995 pp 261–269.

A.J.Bourdillon et al Proximity Correction simulations in Ultra High Resolution Lithography Journal of Physics D: Applied Physics(34) 2001 pp 3209–3213.

* cited by examiner

*Primary Examiner*—Christopher G. Young (57) ABSTRACT

Mask Shaping using temporal and spatial Coherence for Ultra High Resolution Lithographic imaging and printing refers to methods and apparatus that can be adopted to print near-ideal images of basic shapes when the shapes are asymmetrical. Ultra High Resolution Lithography refers to proximity printing of clear mask fetures when they are demagnified by bias. In this lithography, optical components, including lenses and mirrors, are not used between the mask and wafer. When a clear mask feature is asymmetric and the mask-wafer gap is set so that the Critical Condition is maintained for the shortest print dimension, then undesirable features typically appear in other longer dimensions consistent with Fresnel diffraction. The undesirable featurs impede illumination uniformity for controlled printing in exposed areas. Such features, including Bright Spots and Ripple, are counteracted by the Mask Shaping that is designed to optimize printing with temporal and spatial coherence near the Critical Condition. Even with broad band illumination, ultra high resolution is not lost. On the contrary, with Mask Shaping near the Critical Condition, the undesirable features occurring parallel to the longer dimensions, are normally reduced or eliminated. Near-ideal shapes can be printed. With Mask Shaping for temporal and spatial coherence, production parameters, including resolution, exposure time, and illumination band width can be enhanced, traded, and optimized.

4 Claims, 6 Drawing Sheets

MASK SHAPING USING TEMPORAL AND SPATIAL COHERENCE IN ULTRA HIGH RESOLUTION LITHOGRAPHY

CROSS-REFERENCE TO RELATED APPLICATIONS

Not applicable.

STATEMENT REGARDING FEDERALLY SPONSORED RESEARCH AND DEVELOPMENT

Not applicable

BACKGROUND

1. Field of the Invention

This invention applies to micro-lithography and the application of micro-lithography as a tool in the development and production of micro-electronic and micro-mechanical devices and of integrated circuits.

2. Description of Prior Art

Background.

Ultra High Resolution Lithography has many advantages but one significant shortcoming when it is used for printing asymmetric, two-dimensional patterns.

The printing is achieved by demagnifying clear mask features without the use of either lenses or mirrors between a mask and a resist. The resist is coated onto a wafer and the mask is placed in proximity to the wafer, separated by a precise gap. The demagnification results from the positive use of two-sided bias in Ultra High Resolution Lithography. Typically, X-rays are used for exposing the resists, spin-coated onto a silicon wafer, and placed near a Critical Condition with respect to the mask. Besides this mask-wafer gap, the Critical Condition depends on clear mask feature size and on the wavelengths of radiation used.

In Ultra High Resolution Lithography, as in Next Generation Lithography, the classical concept of fidelity in the reproduction of masks had been relaxed. The use of masks with comparatively large clear features and used with comparatively large mask-wafer gaps provided unexpected extensibility to Proximity X-ray Lithography, which had previously required classical fidelity in the reproduction of masks, including 1:1 printing (i.e. not demagnified). The extensibility is accompanied by many further subsidiary benefits including the elimination of well-known side-bands often observed previously in the printing of periodic structures. The fact that neither high precision lenses nor high precision mirrors are needed and that the light source is typically bright, with short exposure times and high throughput, provides significant advantages for the production of next generation semiconductors.

Among NGLs competing for sub-100 nm patterning, Proximity X-ray Lithography is the most advanced and mature, so that extensibility, through Ultra High Resolution Lithography, is of special significance. The technique can be used as much for the printing of modem semiconductor integrated circuits as for fabricating micromachines and micro-electro-mechanical systems. However, printing from asymmetrical two dimensional masks produces special effects which are corrected in the present invention.

Ultra High Resolution Lithography has been demonstrated to produce prints at 25 nm spacing from one-dimensional line grids. If patterns to be printed are not symmetrical, intensity variations occur along different axes. This is chiefly because the Critical Condition cannot then be maintained accurately for both (e.g. vertical and horizontal) axes. The present invention provides a procedure for optimizing Ultra High Resolution Lithography when printing asymmetric two-dimensional patterns. The invention shows how to correct the variations, by applying temporal and spatial coherence in wave interference at the Critical Condition, and through the use of adjustments to the shapes of masks. The invention has special significance for applications using rapid exposures with broad band radiation sources, since, with these sources, temporal coherence is otherwise generally detrimental to resolution unless properly managed.

The invention is a unique method that is specific to ultra high resolution lithography. The method is used to define mask shapes which differ from all previous methods for proximity corrections because this method alone uses temporal and spatial coherence, with broad band sources, near the Critical Condition and without the use of lenses or mirrors between mask and wafer. The method requires distinctive mask shapes. The method is also uniquely adapted to the printing, with 1 nm wavelength X-rays, of features with dimensions about 20 nm. In these features the invention differs from those of:

U.S. Pat. No. 6,383,697, to Vladimirsky et al. "Ultra High Resolution Lithographic Imaging and Printing and Defect Reduction by Exposure near the Critical Condition.

U.S. Pat. No. 6,194,104 to Hsu that describes a method for improving a lithography process window by employing scaler functions with normal and area vectors.

A paper by O. W. Otto et al. "Automated optical proximity correction—a rules-based approach," Optical/Laser Microlithography VII, Proc. SPIE (2197) 1994, pages 278–293 describes a rules based approach for optical proximity correction.

A paper by S. Shioiri and H. Tanabe "Fast Optical Proximity Correction: Analytical Method," Optical/Laser Microlithography VIII, Proc. SPIE (2440) 1995, pages 261–269 describes a method for calculating proximity corrected features analytically.

OBJECTS OF THE INVENTION

It is an object of the invention to improve the feature shapes printed in Ultra High Resolution Lithography by applying additions or inserts to basic shapes written in masks so as to print near-ideal shapes in the resist.

It is a second object of the invention to reduce, by temporal and spatial coherence, the amplitude of Ripple in the Fresnel patterns used in the exposures.

It is a third object of the invention to even out, by temporal and spatial coherence, the intensity variations, including Bright Spots, typically produced from clear mask features of asymmetric shape.

It is a fourth object of the invention to adjust the intensities in aerial images of basic shapes so as to provide, on development, squarer corners, and straighter edges.

It is a fifth object of the invention to apply temporal and spatial coherence by the selection of bandwidth in incident radiation, so as to optimize the Ripple and Bright Spots for sufficiently uniform illumination and ideal shapes. The selection of bandwidth is done by various, well-known means including the use of filters, use of reflecting mirrors at requisite angles of incidence, and selection of operating parameters of the radiation source.

It is a sixth object of the invention to optimize throughput by selecting bandwidth, consistent with high incident flux and resolution due to temporal and spatial coherence.

It is a seventh object of the invention to apply principles of temporal and spatial coherence to optimize, through simulation, the mask shapes suited to the printing of two dimensional patterns.

It is an eighth object of the invention to print features of dimension reaching to about 20 nm and beyond.

It is a ninth object of the invention to fabricate electronic, mechanical, magnetic or any other devices by the processes described in the above objectives.

It is a tenth object of the invention to fabricate electronic, mechanical, magnetic or any other devices formed by printing on resist-coated wafers made of whatever material.

SUMMARY OF THE INVENTION

In accordance with the present invention, the printing of two-dimensional patterns by Ultra high Resolution Lithography is improved by using masks shaped for temporal and spatial coherence. The invention overcomes a difficulty, or shortcoming in Ultra High Resolution Lithography, of printing two dimensional structures. The difficulty occurs especially where the structures are asymmetrical. Following the principles of the coherence and with an optimization of bandwidth, the invention employs simulations or paradigms of mask shapes to print near-ideal patterns. By these methods Ripple and Bright Spots are reduced or eliminated. By the methods described, exposure times and throughput are optimized, consistent with a required resolution in printing.

BRIEF DESCRIPTION OF THE DRAWINGS

The present invention will become more fully understood from the detailed description given below and the accompanying drawings which are given by way of illustration only, and thus are not limitative of the present invention, and wherein.

REFERENCE NUMERALS IN DRAWINGS

10. X-rays
11. Clear mask feature
12. Print on wafer
13. Cornu spiral
14. Vector showing maximum amplitude on axis at the Critical Condition
15. Adapted spiral with range $\delta v = \pm 0.2$
16. Adapted spiral with range $\delta v = \pm 0.4$
17. Adapted spiral with range $\delta v = \pm 0.6$
18. Rectangular clear mask feature
19. Simulated aerial image due to mask feature 18 at Critical Condition ($\Delta v = 2.4$) with monochromatic incident rays.
20. Simulated aerial image away from the Critical Condition ($\Delta v = 1.4$), with loss in resolution.
21. Simulated aerial image at the Critical Condition using broad band of incident wavelengths ($1.2 \leq \lambda < 6.2$ nm).
22. Simulated aerial image away from the Critical Condition ($\Delta v = 1.4$) using broad band of incident wavelengths.
23. Rectangular clear mask feature with chopped-off corners
24. Simulated aerial image due to mask feature 23 at the Critical Condition using a broad band of incident wavelengths ($1.2 \leq \lambda < 6.2$ nm).
25. Rectangular clear mask feature with 30 degree V-shaped indents
26. Rectangular clear mask feature with 45 degree V-shaped indents
27. Rectangular clear mask feature with 60 degree V-shaped indents
28. Rectangular clear mask feature with blurred 45 degree V-shaped indents (cf. 26)
29. Simulated aerial image due to mask feature 25 at the Critical Condition with broad band radiation
30. Simulated aerial image due to mask feature 26 at the Critical Condition with broad band radiation
31. Simulated aerial image due to mask feature 27 at the Critical Condition with broad band radiation
32. Simulated aerial image due to mask feature 28 at the Critical Condition with broad band radiation

DETAILED DESCRIPTION OF INVENTION

Main embodiment

Next Generation Lithography Definition:

The departure from the classical concept of fidelity in the reproduction of masks.

This includes demagnification.

Ultra High Resolution Lithography Definition:

Ultra High Resolution Lithography is performed by proximity printing (without lenses or mirrors between mask and wafer) from masks placed at or near the Critical Condition (see below). The technique makes positive use of Fresnel diffraction and relaxes the classical requirement for fidelity in reproduction and, in particular, for 1:1 printing in proximity. Ultra High Resolution Lithography capitalizes upon the enhancement of resolution that results from the deliberate application of two sided bias in lithographic imaging and printing. This enhancement is achieved preferably, but not necessarily, when optimized at or near the "Critical Condition", but also anywhere downstream from the mask. Controlled resist processing is used to select the magnitude of demagnification by bias. The term "bias" or "two sided bias" is defined as the difference between mask feature size, W, and printed feature size, $\omega$, i.e. the pattern width at the selected development level. More formally bias is defined as, $b = W - \omega$).

Figure 3:
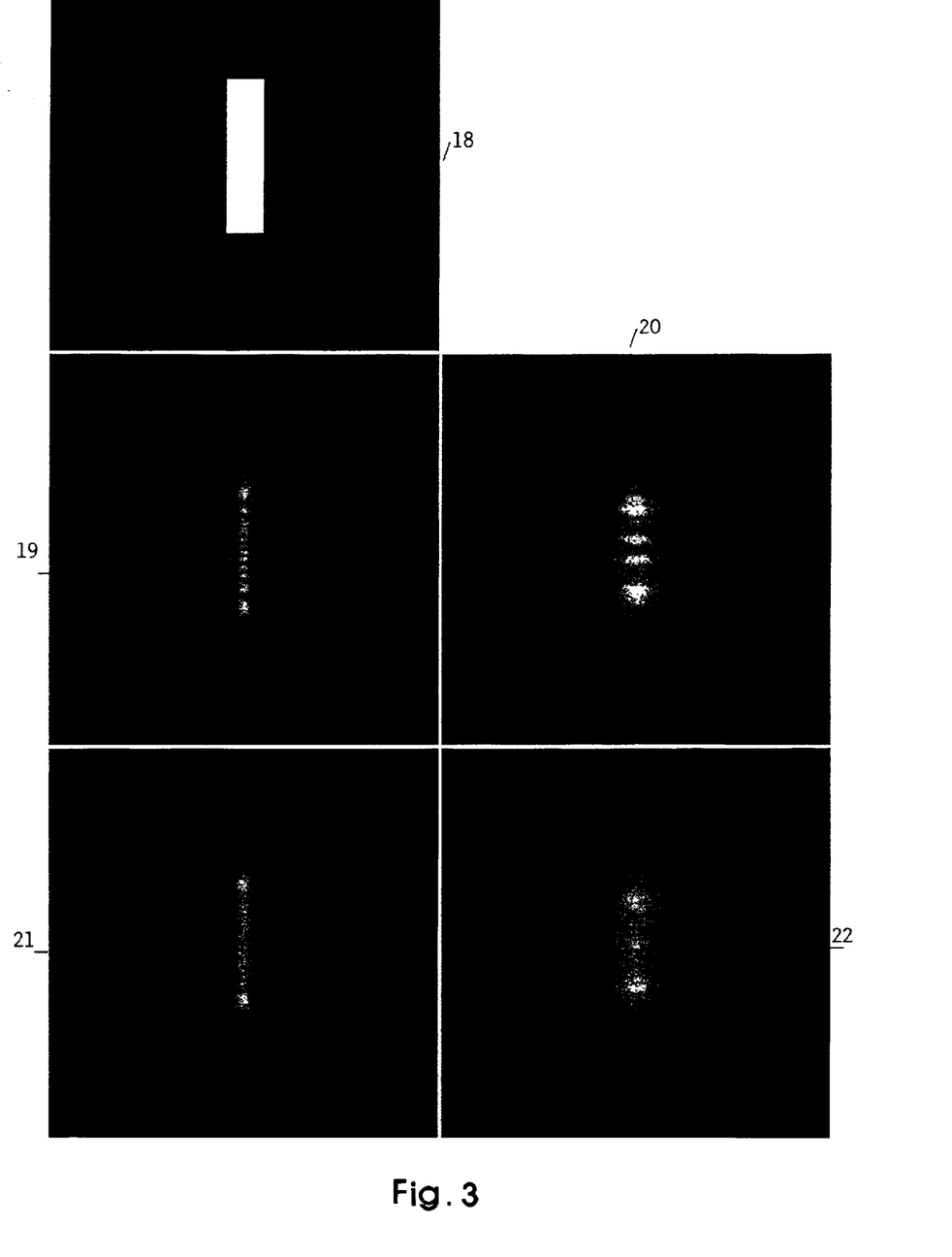
FIG. 3 represents, at top, a two-dimensional rectangular clear mask feature 18 with, below, various images simulated at various conditions.

Ripple Definition:

Consider an aerial image at a wafer due to light waves passing through an asymmetric clear mask feature, such as a rectangle (18 FIG. 3). If the mask-wafer gap is set to maintain the Critical Condition for the shorter dimension, and if monochromatic radiation is used, a Ripple appears along the longer dimension (FIG. 3). Ripple is a cause of intensity variations in the exposed resist.

Bright Spots Definition:

Under the same conditions as above, Bright Spots (FIG. 3) will occur near the extremities of the longer dimension due to well known maxima in the Fresnel diffraction patterns. Bright Spots are a cause of intensity variations in the exposed resist.

Critical Condition for One Dimensional Features.

Figure 1:
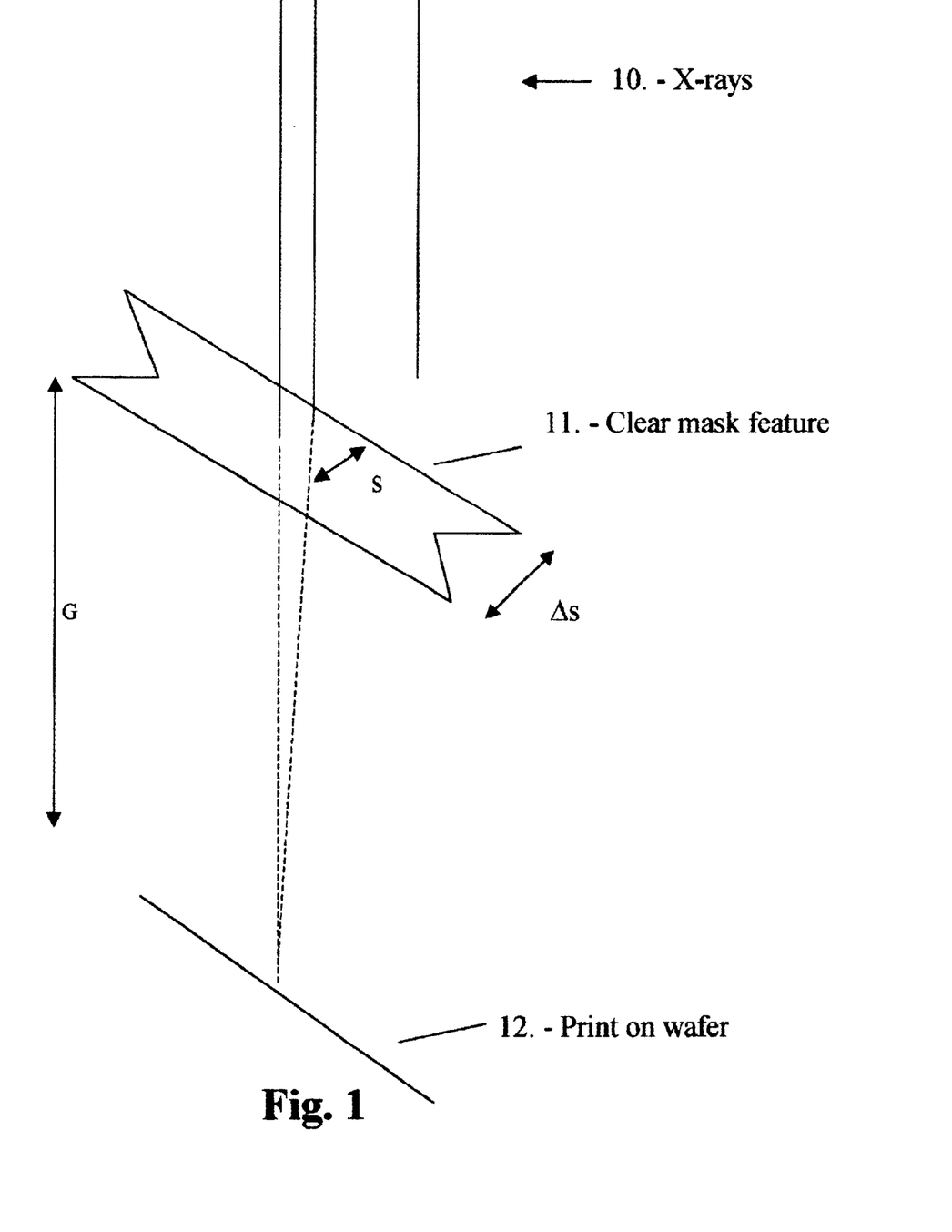
FIG. 1 is a schematic exposure system according to the invention including three rays of radiation 10 from a distant synchrotron radiation source, two of which pass through a clear mask feature 11. These latter rays, in combination with the other transmitted rays, construct a demagnified pattern (or Fresnel image) 12 on the plane of the wafer.

The present invention is used in the context of Ultra High Resolution Lithography. Consider first the Critical Condition as it applies in the imaging and printing of one dimensional features such as lines. FIG. 1 shows a schematic exposure system. Parallel rays of radiation 10 pass through a clear mask feature 11 and form a Fresnel pattern, or demagnified image 12, at a distance G below the mask feature. One ray is shown stopped at the absorber. Another is axial. Between them, a third ray suffers a phase lag which depends on the distance, s, from the center line of the clear mask feature, i.e. the phase lag suffered by this ray at the resist depends on $2\pi \cdot s^2/\lambda$, when the wavelength is $\lambda$.

Consider the dimensionless spatial coordinate, defined:

$$v = s\sqrt{\frac{2}{G\lambda}} = \sqrt{2\tilde{N}_F},\qquad(1)$$

$$\Delta v = \Delta s\sqrt{\frac{2}{G\lambda}}\qquad(2)$$

Where s is a distance measured from the axis of the clear mask feature/clear mask feature in its plane (FIG. 1)

G is the width of the mask/wafer gap (FIG. 1)

$\lambda$ is the wavelength of the radiation used $N_F$ is the number of Fresnel half zones across the clear mask feature v is a dimensionless spatial co-ordinate $\Delta s$ is the clear mask feature width (equal to W)

Figure 2:
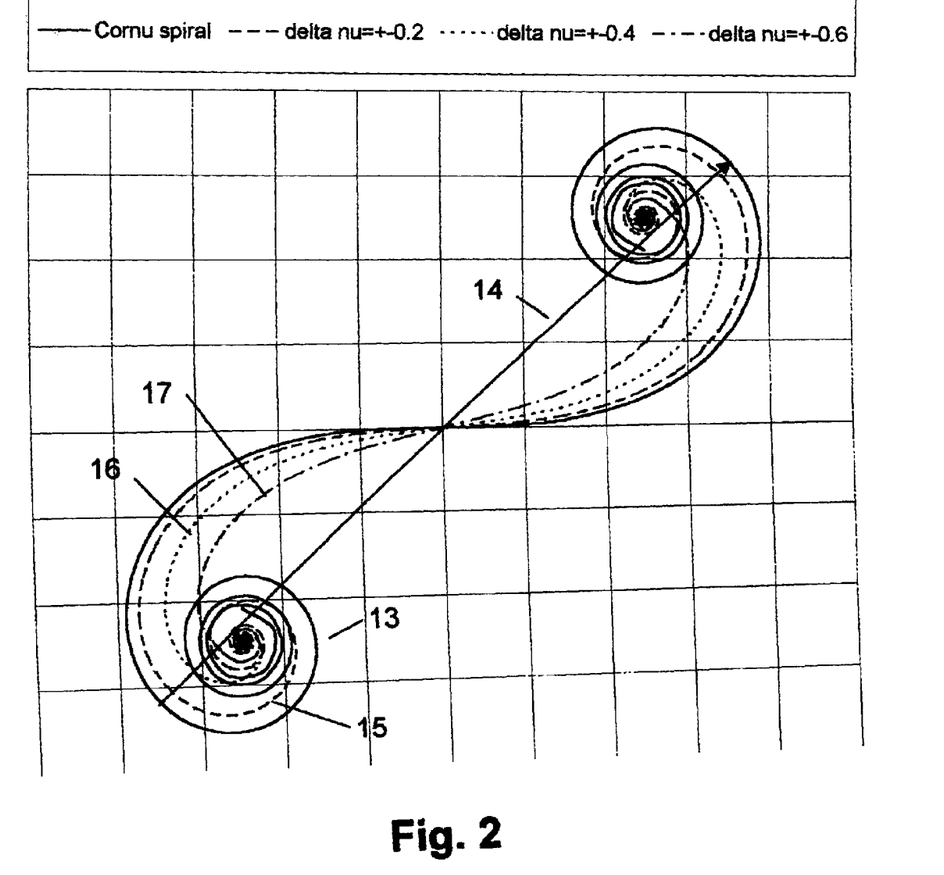
FIG. 2 represents the Cornu spiral 13 (or vibration curve) utilized by the invention and three further curves 15, 16, 17. These three curves show, by averaging of amplitudes and phases of rays, adaptations representing the effects of temporal coherence on the formation of aerial images.

$\Delta v$ is the dimensionless spatial co-ordinate corresponding to $\Delta s$ at a given G and $\lambda$ The vectorial addition of the amplitudes and phases of rays passing through the clear mask feature, and interfering constructively at the plane of the wafer, can be summed over all transmitted rays. The amplitudes are represented mathematically with well-known Fresnel integrals or can be summed graphically with Cornu's spiral 13, otherwise known as the vibration curve, that is shown in FIG. 2. The amplitude of the Fresnel pattern at a point on the wafer can be found by summing amplitudes and phases of corresponding rays. The Critical Condition occurs when the width of a transmitting mask feature, as, is related to the mask/wafer gap G and X-ray wavelength $\lambda$ by the equation:

$$\frac{\Delta s}{\sqrt{\lambda G}} = 1.7 \qquad(3)$$

At the Critical Condition, summing over rays for which $\Delta s/2 > s > -\Delta s/2$, the amplitude at the wafer, on axis, is the longest vector 14 (FIG. 2) which joins two points on the spiral. The square on this vector is the maximum intensity. Off axis at the wafer, other vectors are used to make vectorial sums of ray amplitudes. From these amplitudes, the aerial image can be constructed in the conventional way. Cornu's spiral applies to imaging with monochromatic radiation but we extend it, as described below, to applications using broad band illumination having temporal coherence.

Critical Condition for Two Dimensional Features.

Consider secondly the critical condition for two dimensional clear mask features. Since the Critical Condition depends on clear mask feature size, $\Delta s$, it cannot be maintained for two different dimensions at one time. The Critical Condition then applies, typically, to the smaller dimension where the fine printed resolution is in principle harder to achieve.

Critical Condition with Broad Band Illumination

When the wavelength, $\lambda$, is not monochromatic but is spread over a range $\delta\lambda$, then from equation 1 it follows that $\delta v/v = -\delta\lambda/2\lambda$, and the Fresnel integrals represented in Cornu's spiral can be averaged as in the dashed and dotted curves in FIG. 2. The averaging procedure, by including vectorial additions of rays, accounts for the temporal coherence. Specifically, with broad band illumination, such that the bandwidth corresponds to $\delta v = \pm 0.2$, the ray phases can be represented by the tangents on the dashed curve 15 in FIG. 2. Corresponding phases at a wafer, for bandwidth ranges $\delta v = \pm 0.4$, are represented by tangents on the dotted curve 16 and, for bandwidth ranges $\delta v = \pm 0.6$, by the dash-dot curve 17 in FIG. 2.

The amplitudes of vectors constructed on these spiral graphs show, firstly, that Ultra High Resolution Lithography is extended, with insignificant loss in resolution, by the temporal coherence till $\delta v <= 0.6$. By contrast, away from the Critical Condition, there is serious loss in resolution. The difference is initially surprising and these plots, designed for simulating prints from one dimensional slits, provide the understanding that correlates with the two dimensional simulations shown in FIGS. 3–5. These discoveries arc employed in defining mask shapes for the present invention.

Secondly, the faster spiral inwards at large $\delta v$, due to the temporal coherence in Ultra High Resolution Lithography, results in a reduction in high frequency Ripple. This reduction is simulated in FIG. 3, by comparing 21 with 19.

The invention uses this understanding of temporal coherence in Fresnel diffraction, shown by the spiral curves. The invention provides a method that is used to improve the printing of two dimensional features in Ultra High Resolution Lithography. While the Critical Condition can be uniquely defined for one dimensional slits; when two dimensional mask features are asymmetric, the Critical Condition cannot be maintained for two perpendicular axes. Typically, the Critical Condition is set for the smaller dimension which is in principle more difficult to print. The Ripple occurs in the direction of the longer dimension (FIG. 3) and Bright Spots occur as intensity variations near the extremities.

The invention includes primarily the structure and operation of two dimensional masks used in proximity printing at or near the Critical Condition. By shaping the ends of the masks and taking advantage of temporal and spatial coherence, uniform intensity can be virtually achieved over the printed area, including the elimination both of the Bright Spots and of the high frequency Ripple along the longer dimension. The shaping can be optimised by simulation.

The invention also provides a procedure for selecting optimum bandwidth for uniform illumination at the resist and for near-ideal prints.

Operation—Main Embodiment

Typically, Ultra High Resolution Lithography printing is employed at or near the Critical Condition by the appropriate setting of the mask-wafer gap. The dimensionless spatial co-ordinate will then be $\Delta v = 2.4$. For the printing of two dimensional patterns, the Critical Condition is typically set for the shorter pattern dimension.

Typically, 0.8 nm (1.5 kV) X-rays are used in the illumination within the dimensionless range $\Delta v=2.4\pm0.2$, corresponding to a photon wavelength range $0.55<\lambda<1.1$ nm (or energy range $1<\epsilon<2$ kV). The Critical Condition is set, by gap and (smallest) mask feature size, at the mean value of the range. Typically a synchrotron X-ray source is used.

Typically, the masks are made by conventional means. The masks consist, typically, of either a gold absorber on a transmitting silicon nitride substrate or of a tantalum compound absorber on a transmitting silicon carbide substrate.

Typically, a V-shaped indent is fabricated, during manufacture, into the mask 26 at the extremities of the ends of a longer dimension in a feature to be printed. The V-shaped indent was shown to be effective in the case of printing from a rectangular mask with aspect about 4:1 long:short dimensions. In this case an acute angle in the V about 45 degrees was found by simulation to be effective. More generally, various simulations are performed to determine the optimum indent for a given mask feature shape. Again more generally, the simulations include indents, additions and outriggers, designed to optimise spatial and temporal coherence for the printing of near-ideal shapes.

No lenses, mirrors or other optics are placed between the mask and wafer which are maintained, typically, in precise proximity at a calculated separation.

Typically, a bandwidth is selected by a variety of means, including use of filters, reflecting mirrors, use of source operating parameters, and of simulations of exposures due to indented masks, for near-ideal printing with optimum exposure times.

Typically, exposures are made to relate to a development level, parametrized in a controlled development process, so that a corresponding bias is developed for a selected demagnification. Resists and wafers are otherwise conventional.

Simulated Exposures with Various Mask Shapes and Employing Temporal and Spatial Coherence FIG. 3 shows a rectangular clear mask feature 18 and simulated images 19, 20 for critical and non-critical gaps and monochromatic radiation. For broad band radiation respective simulations are also shown 21, 22. Resolution is maintained with broad band radiation with a reduction in Ripple but retaining Bright Spots at the extremities. The rectangular feature is an example of a basic shape used for forming paradigms for mask shapes. In this invention the mask shape is adjusted for temporal and spatial coherence in Ultra High Resolution Lithography in order to print a near-ideal shape.

Specifically in FIG. 3, item 18 represents the two-dimensional rectangular clear mask feature. An aerial image 19, is simulated using the SEMPER program. The mask to wafer gap is set near the Critical Condition (dimensionless spatial co-ordinate, $\Delta v=2.4$ corresponding to the width) due to monochromatic incident rays. Item 20 shows a simulated aerial image away from the Critical Condition ($\Delta v=1.4$), with loss in resolution. The simulated Ripple in the intensity due to the longer dimension, and the Bright Spots near the ends are both significantly reduced in the aerial image. Item 21 shows an aerial image simulated at the Critical Condition but using a broad band of incident wavelengths ($1.2 \leq \lambda < 6.2$ nm). The sharp resolution simulated, in spite of the bandwidth and spread in dimensionless spatial co-ordinate, is due to temporal and spatial coherence. Item 22 shows a simulation made away from the Critical Condition ($\Delta v=1.4$). Resolution is again lost while Bright Spots remain and Ripple is reduced.

The simulations demonstrate the importance of exposing near the Critical Condition when temporal coherence provides excellent resolution in broad band illumination and when there is a wide range in the dimensionless spatial co-ordinate, $\Delta v$. The subsequent simulations were all performed with broad band illumination.

Figure 4:
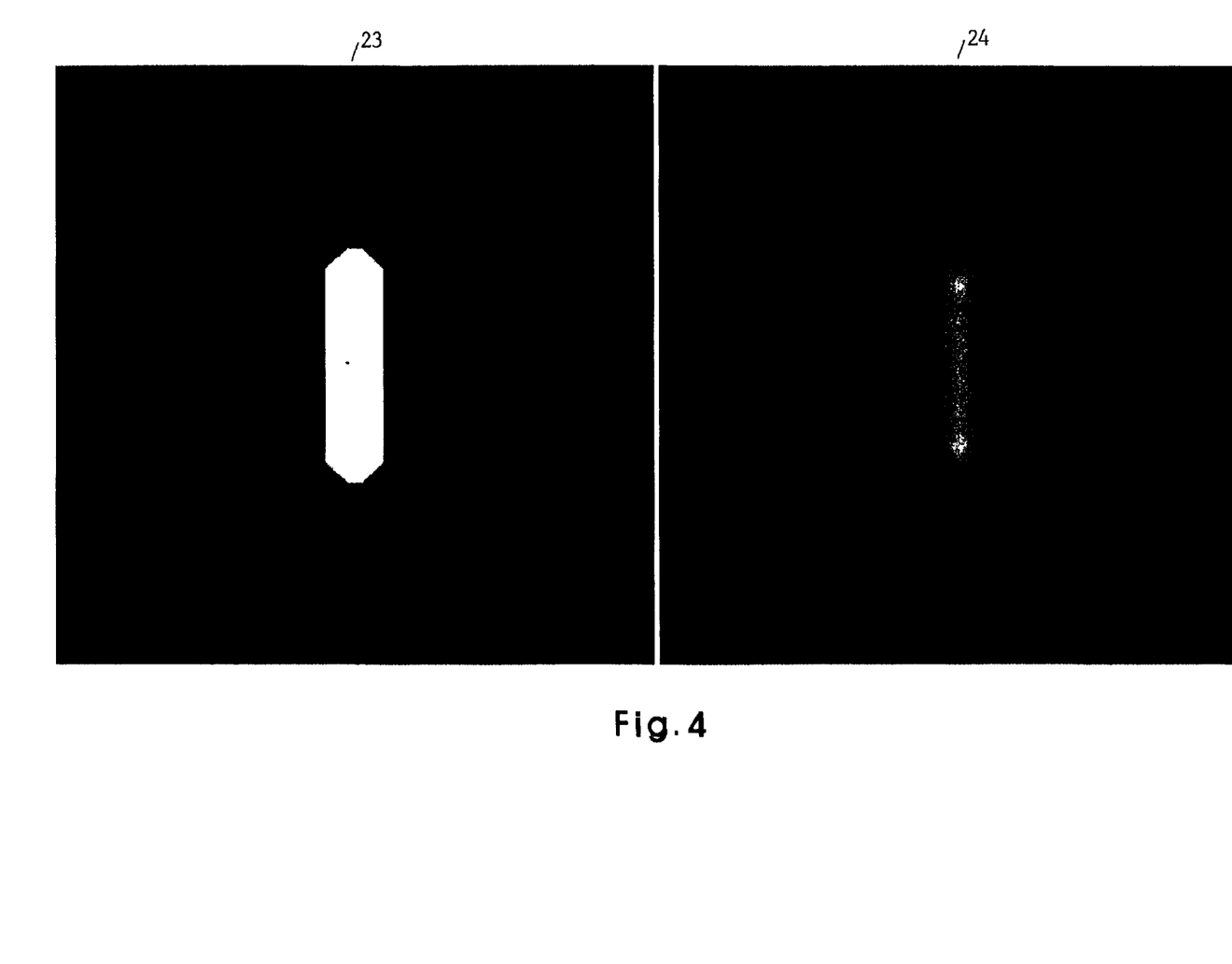
FIG. 4 represents a two-dimensional rectangular mask clear mask feature as in FIG. 3, but with chopped-off corners 23. The simulated aerial image at right is made with broad band illumination and at the Critical Condition.

FIG. 4 represents a two-dimensional rectangular clear mask feature 23 similar, except for chopped-of corners, to the feature 18 in FIG. 3. The corresponding simulation in item 24 compares with the respective simulation 21 in FIG. 3, i.e. performed at the Critical Condition with the broad band illumination. Item 24 shows preserved resolution and reduced Ripple but retained Bright Spots near the extremities.

Figure 5:
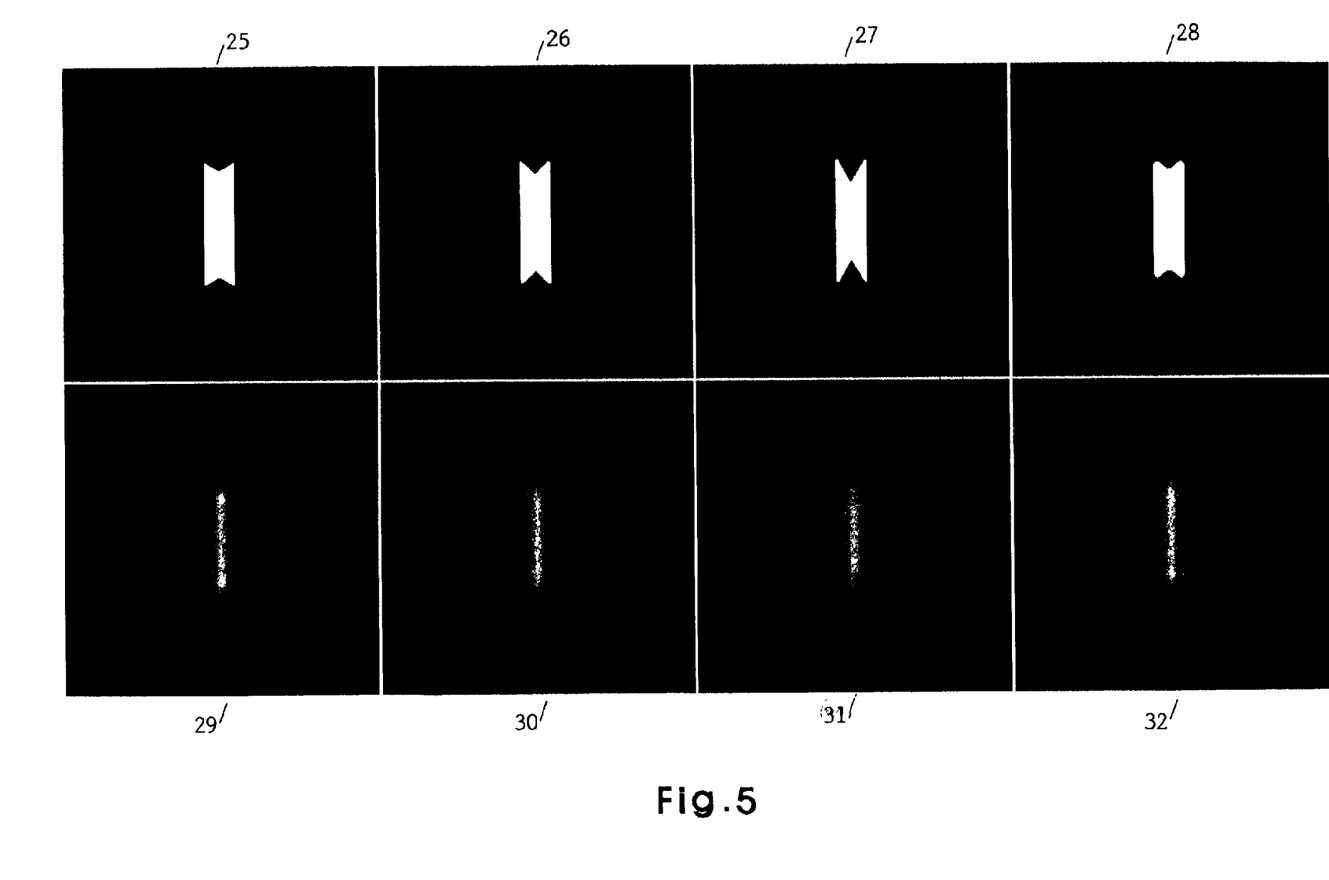
FIG. 5 represents four mask shapes 25, 26, 27, 28 modified from the rectangle 18 in FIG. 3. Respective simulations performed at Critical Condition with broad band illumination are also shown.

FIG. 5 represents a set of masks with various V-shaped indents 25, 26, 27, 28 having various angles and corresponding aerial images, 29, 30, 31, 32, simulated with the broad band illumination near the Critical Condition. For this aspect of 4:1, and for the given conditions, an angle of 45 degrees was shown to virtually eliminate the Bright Spots at the extremities without degrading resolution.

Specifically, FIG. 5 represents two-dimensional rectangular clear mask features similar to the rectangle 18 in FIG. 3, but modified by having a V-shaped cut-out at angle 30 degrees 25. Item 26 represents a similar rectangle, but modified with a V-shaped cut-out at angle 45 degrees. Item 27 represents a similar rectangle, but modified with a V-shaped cut-out at angle 60 degrees. Item 28 represents a rectangle similar to 26, but modified with a V-shaped cut out having a blurred angle about 45 degrees. Corresponding simulations using the broad band illumination at the Critical Condition, are shown respectively in 29, 30, 31, 32. The simulation for the V-shaped cut-out at angle 45 degrees (FIG. 5-F) shows the greatest reduction in Bright Spots combined with insignificant Ripple and retained resolution. The shape of the aerial image is also comparatively square.

These results demonstrate the importance of simulating images from masks, modified to reduce Bright Spots and Ripple. Demagnification occurs without significant loss in resolution and near-ideal shapes can be printed. Blurred patterns are generally beneficial and simplify the mask fabrication process.

Figure 6:
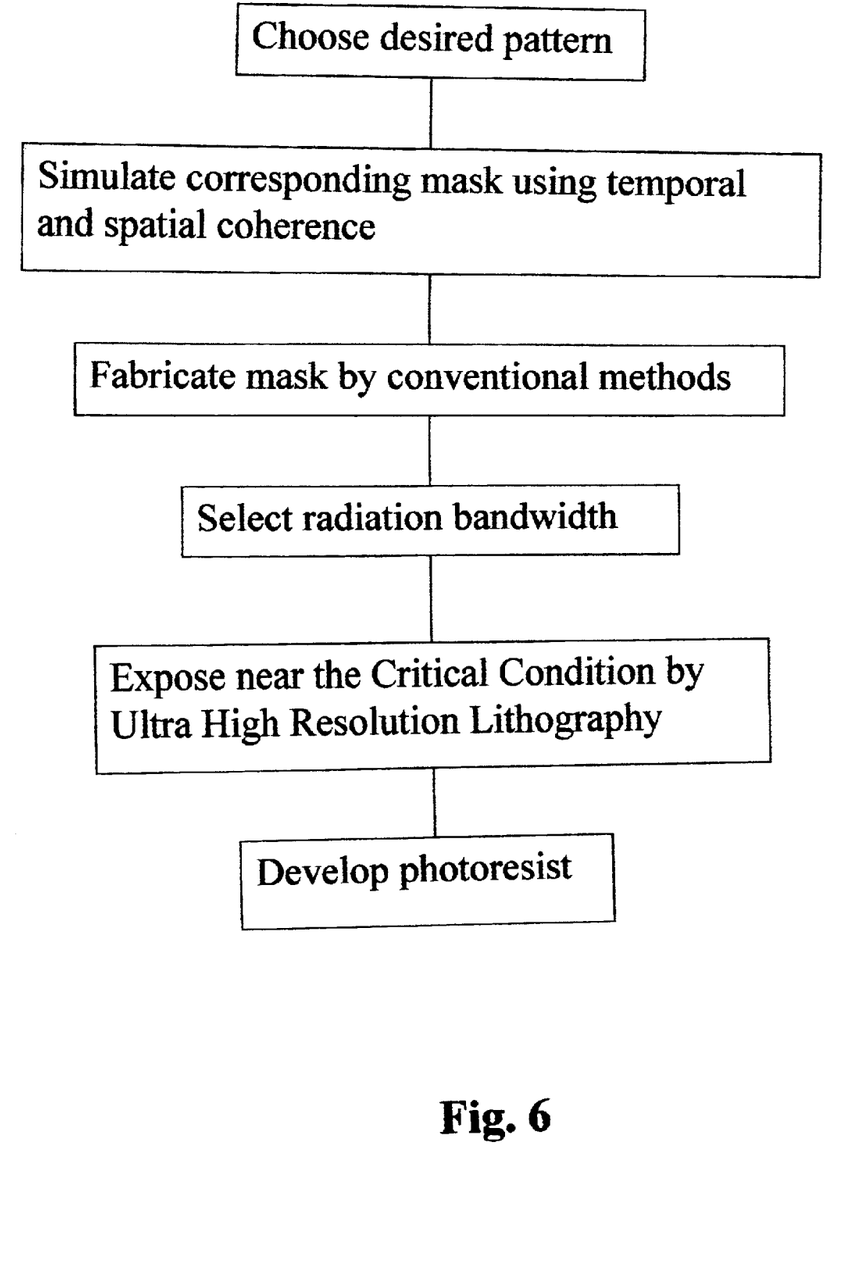
FIG. 6 is a high level flow chart showing the inventive procedure.

The typical procedure employed in our invention is illustrated in FIG. 6, including choice of desired pattern, simulation of mask using temporal and spatial coherence, fabrication of mask by conventional means, the selection of radiation bandwidth, and exposure of positive or negative resists coated on a wafer placed near the Critical Condition with respect to the mask.

Finally the resist is developed using a selection of parametrized development levels, and using modern control in the development process.

By using the invention, printed features of dimension about 20 nm, and less, can be achieved with controlled exposure intensities and printed features.

Further scope and applicability of the present invention will become apparent from the detailed description. However, it should be understood that the detailed description and specific examples, while indicating preferred embodiments of the invention, are given by way of illustration only, since various changes and modifications within the spirit and scope of the invention will become apparent to those skilled in the art from the detailed description.

Alternative Embodiments

Printing corrections in Ultra High Resolution Lithography by mask shaping and using spatial and temporal coherence can be applied to proximity printing using radiation or matter, including electromagnetic radiation, or electrons, protons, or ions, of whatever wavelength. Likewise, the invention applies to any proximity printing using sources of whatever type, whether parallel sources or point sources, and whether electromagnetic or particle sources.

Comparing broad band sources with narrow band sources or line sources, the basic principles of the invention apply to both but with different emphasis. With narrow band sources, printed resolution is less sensitive to variations of the mask-wafer gap from the gap defined by the Critical Condition.

A mask shape is used in combination with spatial and temporal coherence to print a near-ideal pattern of required shape. An approximately rectangular print was given as an example; but for different shapes and different aspect ratios, different indents or additions will be found. Such indents or additions will be found by various means, including simulation and the application of paradigms such as the V-shaped indents in the rectangular pattern 16.

The invention applies even when printing is done away from the Critical Condition. For example, $\Delta v$ may lie in the range $0.12 < \Delta v < 0.36$ providing Ultra High Resolution.

The invention applies to proximity printing from any type of mask including stencil masks or any mask containing absorbing and transmitting regions.

The invention applies to proximity printing on any type of resist including positive and negative resists.

The invention applies to printing on resists coated onto any substrate including silicon, gallium arsenide or any other material Ultra High Resolution Lithography Mask Shaping for temporal and spatial Coherence applies to lithography using radiation or matter of whatever wavelength by proximity printing.

The Invention being thus described, it will be obvious that the same may be varied in many ways. Such variations are not to be regarded as departure from the spirit and scope of the invention, and all such modifications as would be obvious to one skilled in the art are intended to be included within the scope of the following claims.

Advantages

From the description above, a number of advantages in Mask Shaping by Temporal and Spatial Coherence in Ultra high Resolution Lithography become evident:

Asymmetric shapes that are near-ideal can be printed

Resolution is enhanced, especially for asymmetric shapes

Bright Spots are virtually eliminated

Ripple is virtually eliminated

Corners are squared and edges are straightened

Bandwidth and throughput are enhanced

Conclusion, Ramifications and Scope

The invention provides the means, methods and principles for optimizing the printing of two-dimensional patterns in Ultra high Resolution Lithography. The means, methods and principles apply to proximity printing by radiation or matter of whatever wavelength. The method has the general advantages of Ultra high Resolution and of physical simplicity. The method is also available with bright sources and so has additional advantage of speed and high throughput. The method is applicable to a wide range of manufacturing including advanced integrated circuits, micromachines and electromechanical machine systems.

More specifically, the invention includes many further advantages when applied in the context of Ultra High Resolution Lithography:

masks shaped for temporal and spatial coherence near ideal printing of two dimensional features virtual elimination of printing defects, including Ripple and Bright Spots insignificant loss in resolution due to broad band illumination near the Critical Condition short exposure times optimization of bandwidth and throughput extensibility to a resolution of 20 nm no lenses or mirrors between mask and wafer economic and simple physical system independence from well-known side-bands in 1:1 proximity printing The present invention assumes Ultra High Resolution Lithography, and so is used without imaging optics, including neither lenses nor mirrors, between mask and wafer. It can be used with a broad band of wavelengths and therefore with rapid exposure times.

What is claimed is:

1. A method of shaping a two-dimensional mask and exposing a resist by placing said mask relative to said resist such that a gap width is formed therebetween and such that said resist is not disposed at a real image plane relative to said mask, and a broad band exposure source, comprising:

simulating the exposure of said resist, by methods selected from a group consisting of computation and use of paradigms, so as to employ coherence, selected from a group including temporal coherence and spatial coherence, to control intensity variations in the exposure by using various mask shapes with various corrections, and selecting said mask shapes with said corrections, said corrections consisting of indents to basic clear mask feature patterns, whereby the mask patterns, having sufficient dose uniformity for near-ideal development with respect to the intended pattern, are exposed and developed at selected demagnifications, so as to virtually eliminate artifacts including a group consisting of ripple and bright spots.

2. The method according to claim 1, further comprising:

fabricating said masks with said corrections calculated to form, by said coherence, the near-ideal patterns after developing said resist.

3. The method according to claim 1, further comprising:

calculating, by said coherence, an illumination bandwidth required to optimize exposure time and resolution for given patterns, and selecting said source bandwidth.

4. A mask produced by the method according to claim 1.

* * * * *